United States Patent
Chang et al.

(10) Patent No.: US 7,941,713 B2
(45) Date of Patent: May 10, 2011

(54) PROGRAMMABLE SELF-TEST FOR RANDOM ACCESS MEMORIES

(75) Inventors: Chingwen Chang, Taipei (TW); Wei-Chia Cheng, Hsinchu (TW); Shih-Chieh Lin, Hualien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 295 days.

(21) Appl. No.: 12/198,949

(22) Filed: Aug. 27, 2008

(65) Prior Publication Data
US 2010/0058126 A1    Mar. 4, 2010

(51) Int. Cl.
*G11C 29/00* (2006.01)
(52) U.S. Cl. .......................... 714/718; 714/733; 714/738
(58) Field of Classification Search .................. 324/765; 712/227; 714/710, 733, 718, 738
See application file for complete search history.

(56) References Cited

U.S. PATENT DOCUMENTS

| | | | | |
|---|---|---|---|---|
| 5,157,664 A | * | 10/1992 | Waite | 714/710 |
| 6,255,843 B1 | * | 7/2001 | Kurihara | 324/765 |
| 6,651,201 B1 | | 11/2003 | Adams et al. | |
| 6,715,062 B1 | * | 3/2004 | Moore | 712/227 |
| 6,728,916 B2 | * | 4/2004 | Chen et al. | 714/733 |
| 7,302,623 B2 | * | 11/2007 | Kang | 714/718 |
| 7,308,623 B2 | * | 12/2007 | Slobodnik et al. | 714/718 |

* cited by examiner

*Primary Examiner* — David Ton
(74) *Attorney, Agent, or Firm* — Haynes and Boone, LLP

(57) ABSTRACT

A system that provides large instruction sets for testing memory yet reduces area overhead is disclosed. The system for testing a memory of an integrated circuit comprises a set of registers providing element based programmability for a plurality of tests, wherein each test includes a plurality of test elements; a finite state machine for receiving a plurality of test instructions from the set of registers, wherein the finite state machine dispatches signals instructing a test pattern generator to generate a test pattern; a memory control module for applying the generated test pattern to the memory; and a comparator module for comparing a response received from the memory to a stored, known response.

20 Claims, 3 Drawing Sheets

PROGRAMMABLE SELF-TEST FOR RANDOM ACCESS MEMORIES

BACKGROUND

Integrated circuit (IC) technologies are constantly being improved, including scaling down device geometries to achieve lower fabrication costs, higher device integration density, higher speeds, and better performance. Such improvements provide ICs with optimal quality. ICs are typically tested after manufacture to ensure that the ICs exhibit the quality desired. Testing often involves applying a stimulus to an IC device under test, acquiring the IC device's response, and analyzing and comparing the device's response with a known, desired response. In testing memories of an IC, one approach involves a programmable built-in self-test (BIST) circuit. Conventional programmable BISTs are manufactured on the IC and utilize a separate dependent embedded memory (e.g., a read only memory) for programming a set of test instructions. However, the dependent embedded memory requires large instruction sets when testing complex memory devices, which leads to higher than desirable area overhead.

Accordingly, what is needed is an area efficient programmable BIST architecture that provides multiple complex self-test procedures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
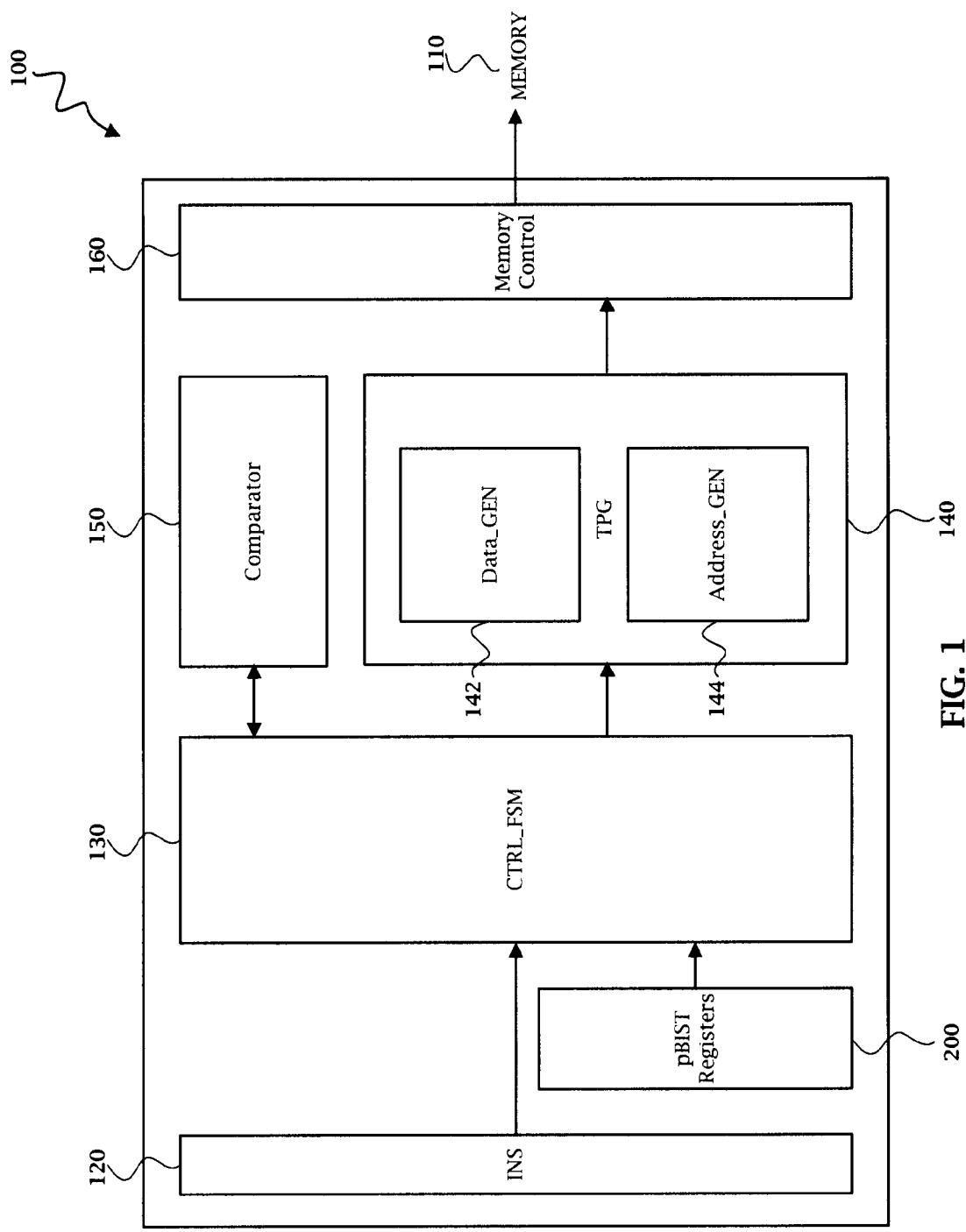
FIG. 1 is a block diagram of a programmable BIST architecture according to one embodiment of the present invention.

The present disclosure relates generally to the field of integrated circuits, and more particularly, to a programmable built-in self-test architecture for testing a memory or memories of an integrated circuit.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 4, a programmable BIST (pBIST) architecture 100 and pBIST registers 200 for testing integrated circuit memories, particularly complex embedded dynamic random access memories, are collectively described below. It is understood that additional features can be added in the pBIST architecture 100 and the pBIST registers 200, and some of the features described below can be replaced or eliminated, for additional embodiments of the pBIST architecture 100 and pBIST registers 200. The present embodiment of the pBIST architecture 100 and pBIST registers 200 allows programming large instruction sets for performing multiple complex self-test procedures while significantly reducing the area overhead required for such instruction sets.

Referring to FIG. 1, the pBIST architecture 100 is provided. The pBIST architecture 100 comprises a memory 110, an instruction module 120, a finite state machine 130, a test pattern generator 140, a data generator 142, an address generator 144, a comparator 150, a memory control module 160, and pBIST registers 200.

The pBIST architecture 100 tests the memory 110 for various faults. The memory 110 may include a single memory or multiple memories under test. The memory 110 may comprise an integrated circuit memory chip, such as random access memory (RAM), read only memory (ROM), other suitable memories, and/or combinations thereof. The RAM may include static random access memory (SRAM), dynamic random access memory (DRAM), synchronous dynamic random access memory (SDRAM), non-volatile random access memory (NVRAM), and/or other suitable random access memories. The ROM may include erasable programmable ROM (EPROM), electrically erasable programmable ROM (EEPROM), flash memory, and/or other suitable read only memories.

The instruction module 120 stores various test instructions, data information, and memory information. The instruction module 120 provides test instructions to the finite state machine 130. Typically, the instruction module 120 stores hard-coded test instructions, including a set of tests (e.g., a set of algorithms). However, storing the test instructions in the instruction module 120 results in large area overhead, and the hard-coded design is not flexible. Conventional pBIST architectures utilizing the instruction module 120 to store large sets of test instructions fail to provide true at-speed test capability and often times provide inadequate ability to perform multiple complex self-test procedures, particularly when testing complex memories such as DRAM.

In the present embodiment, the pBIST registers 200 provide an innovative way to store large sets of test instructions, which is area efficient and does not require hardware modification or redesign of conventional pBIST architectures. The pBIST registers 200 provide element based programmability for the tests (i.e., a test may be programmed element by element). As further discussed below, the ability to program tests element by element includes the ability to run a combination of operations, such as a read and a write, on a memory cell. Such element based programmability for the tests reduces area overhead yet still enables large instruction sets to be run on the memory 110. Table 1 provides examples of tests that may be programmed element by element in the pBIST registers 200.

TABLE 1

| | TESTS |
|---|---|
| Zero-One | {↑(w0); ↑(r0); ↑(w1); ↑(r1)} |
| Checkerboard | {↑(w0 cell1, w1 cell2); ↑(r1 cell1, r0 cell2); ↑(w0 cell1, w1 cell2); ↑(r0 cell1, r1 cell2)} |
| MATS | {↕(w0); ↕(r0, w1); ↕(r1)} |

TABLE 1-continued

TESTS

| | |
|---|---|
| MATS+ | {⇕(w0); ↑(r0, w1); ↓(r1, w0)} |
| MATS++ | {⇕(w0); ↑(r0, w1); ↓(r1, w0, r0)} |
| March X | {⇕(w0); ↑(r0, w1); ⇕(r1, w0); ⇕(r0)} |
| March C | {⇕(w0); ↑(r0, w1); ↑(r1, w0); ⇕(r0); ↓(r0, w1); ↓(r1, w0); ⇕(r0)} |
| March C− | {⇕(w0); ↑(r0, w1); ↑(r1, w0); ↓(r0, w1); ↓(r1, w0); ⇕(r0)} |
| March Y | {⇕(w0); ↑(r0, w1, r1); ↓(r1, w0, r0); ⇕(r0)} |
| MOVI | {↓(w0); ↑(r0, w1, r1); ↑(r1, w0, r0); ↓(r0, w1, r1); ↓(r1, w0, r0)} |
| Disturb | {⇕(w0); ↑(r0, w1); (pause); ⇕(r1, w0); (pause); ⇕(r0)} |

Each test provided in Table 1 detects different types of faults in the memory (or memories) 110 under test. "↑" signifies that the operation starts at a lowest address in the memory and proceeds to a highest address in the memory. "↓" signifies that the operation starts at a highest address in the memory and proceeds to a lowest address in the memory. "⇕" signifies that the address order is irrelevant, the operation may start from the highest address in the memory and proceed to a lowest address, or the operation may start from the lowest address in the memory and proceed to a highest address. "W" signifies writing to the memory 110 under test, and "R" signifies reading from the memory 110 under test. "0" signifies that a predetermined data pattern is either written or read, and "1" signifies that the complement of the predetermined data pattern is to be either written or read. "pause" signifies no operation or NOP, an instruction that does nothing.

The Disturb test, in the present embodiment, provides a method for dynamic disturb fault testing, particularly important when testing dynamic random access memory, wherein the "pause"/NOP can be programmed as a single element. The novel test includes the following steps:
1. Write 0's to all locations in any address order.
2. Read 0 at the lowest address, write 1 at the lowest address, repeating this series of operations until reaching the highest address.
3. Pause/NOP, i.e., nothing is done to the memory array.
4. Read 1 and write 0 in any address order, repeating this series of operations until reaching either the lowest address or highest address depending on the address order chosen.
5. Pause/NOP, i.e., nothing is done to the memory array.
6. Read 0 in any address order, repeating this operation until reaching either the lowest address or highest address depending on the address order chosen.

The pause/NOP element provides the ability to test data retention of a DRAM. It is understood that the "pause"/NOP element may be programmed into any test and is not limited to the Disturb test.

Figure 2:
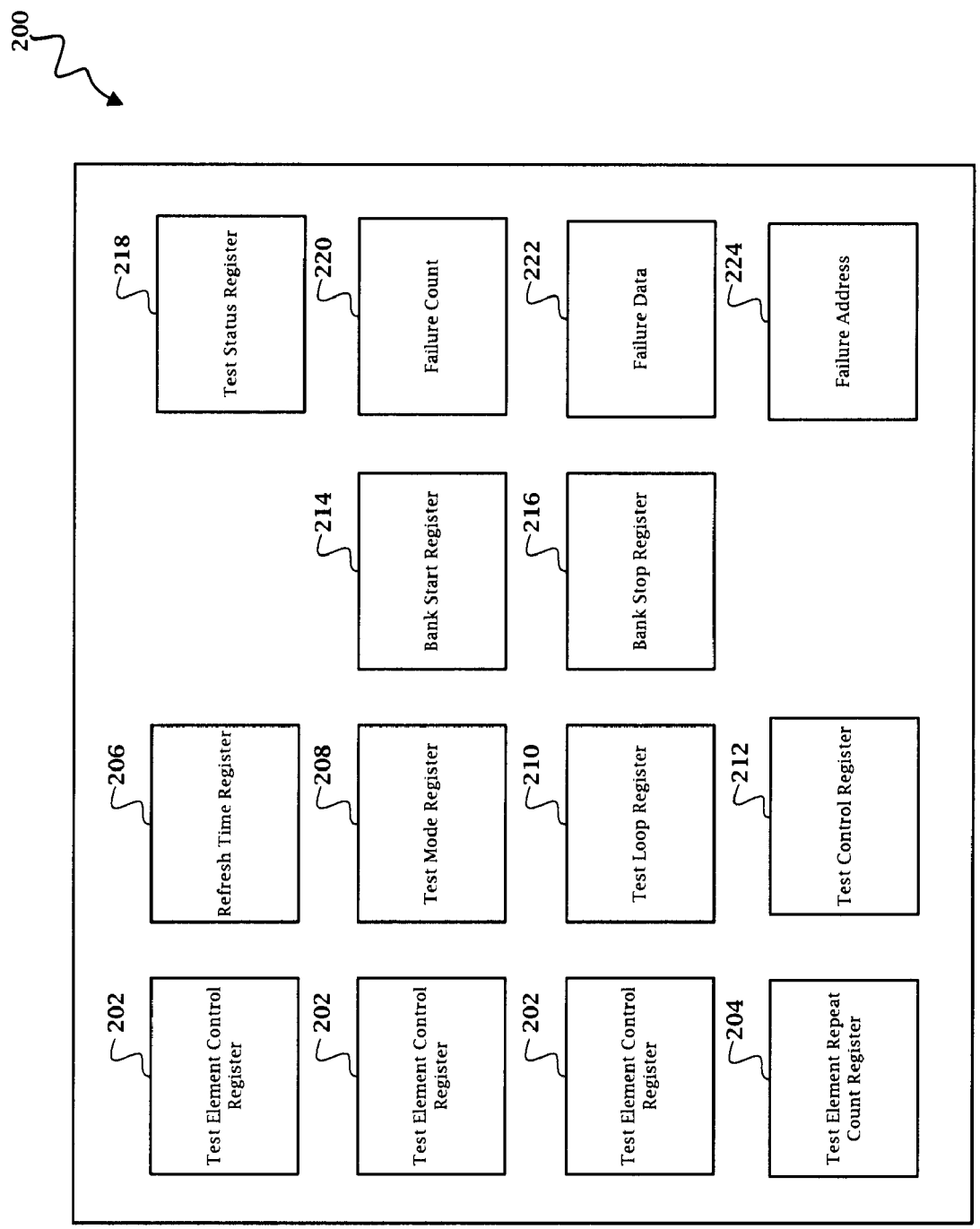
FIG. 2 is a block diagram of a set of programmable BIST registers according to one embodiment of the present invention.

The pBIST registers 200 reduce dependence on another dependent embedded memory as the source for generating test address signals, test data signals, and control signals for the memory 110 under test. Referring to FIG. 2, the pBIST registers 200 include a plurality of test element control registers 202, a test element repeat count register 204, a refresh time register 206, a test mode register 208, a test loop register 210, a test control register 212, a bank start register 214, a bank stop register 216, a test status register 218, a failure count register 220, a failure data register 222, and a failure address register 224. It is understood that the number, variety, and functions of the pBIST registers 200 are not limited to those listed or discussed below. The pBIST registers 200 may provide additional functions. The pBIST registers 200 may further include any combination of the functions performed by one or more registers.

The test element control registers 202 provide element based programmability of the tests. The plurality of test element control registers 202 defines a plurality of test elements. Particularly, each test element control register 202 may program a single element of a test. For example, if the pBIST registers 200 include sixteen test element control registers 202 (wherein each test element control register 202 has multiple control bits), then sixteen elements may be programmed. It is understood that the set of pBIST registers 200 may comprise any number of test element control registers 202.

Figure 3:
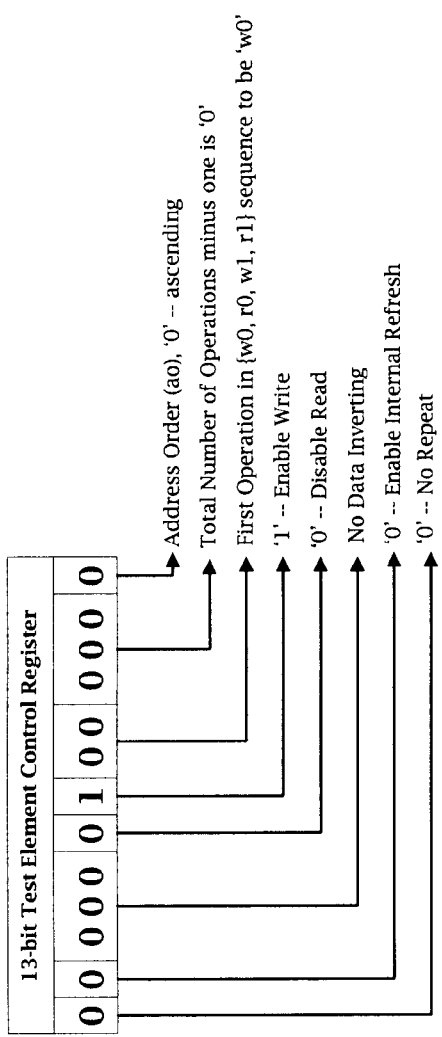
FIG. 3 illustrates an example of a programmed test element control register included in a set of programmable BIST registers according to one embodiment of the present invention.

FIG. 3 provides one embodiment of a programmed test element control register. The programmed test element control register may comprise thirteen control bits. The plurality of test element control registers 202 may comprise any suitable number of control bits. In alternate embodiments, the plurality of test element control registers 202 may comprise a control bit for any suitable function and/or any combination of control bits providing various functions, such functions and combinations not being limited to those discussed below.

The test element control register is programmed for the first element in the Zero-One test, "w0". A first bit is a programmable repeat bit, specifying whether the particular test element will be repeated. In the present embodiment, the first bit is a "0", which indicates that the repeat function is disabled. If the first bit is a "1", then the repeat function is enabled. When the repeat function is enabled, the test element repeat count register 204 defines the number of times the test element will be repeated. In some embodiments, the pBIST registers 200 may comprise a plurality of test element repeat count registers 204 so that each test element control register 202 corresponds with a test element repeat count register 204. The programmable repeat bit provides a programmable retention test, particularly useful when testing the retention of DRAM. For example, a test element control register may be programmed for the "pause" element in the Disturb test introduced above, and further programmed to enable the repeating function for the "pause" element. Repeating the "pause" element any number of times tests the ability of the DRAM to maintain data.

A second bit in the programmed test element control register is a programmable refresh bit, indicating whether the internal refresh function will be enabled. In the present embodiment, the internal refresh is enabled. When the internal refresh bit is enabled, the refresh time register 206 specifies the time (or times) to insert a refresh.

Next, a three bit field (the third, fourth, and fifth bits) is a data inverting control that specifies whether the data will be inverted. The programmed test element control register further comprises a read control bit (the sixth bit) and a write control bit (the seventh bit), which disables or enables the read and write functions. The separate programmable read and write control bits enable a combination of operations to be performed on a memory cell (i.e., if the read and write control bits are set to enable the read operation and the write operation, then the read and write operations will be performed on a first memory cell before proceeding to the second memory cell). In the present embodiment, since the programmed test element control register is programmed for the first element in the Zero-One test, "w0", the write function is enabled and the read function is disabled.

A two-bit field comprising the eighth and ninth bits indicates the first operation in the test sequence. A three-bit field comprising the tenth, eleventh, and twelfth bits indicates the total number of operations minus one. A thirteenth bit indicates an address order, such as whether the test element will be run in an ascending order or a descending order. When the address order bit is a "0", the addresses are read in an ascending order, beginning with the lowest address location and continuing through each successively higher address location until the highest address is reached. When the address order bit is a "1", the addresses are read in a descending order, beginning with the highest address location and continuing through each successively lower address location until the lowest address is reached.

Figure 4:
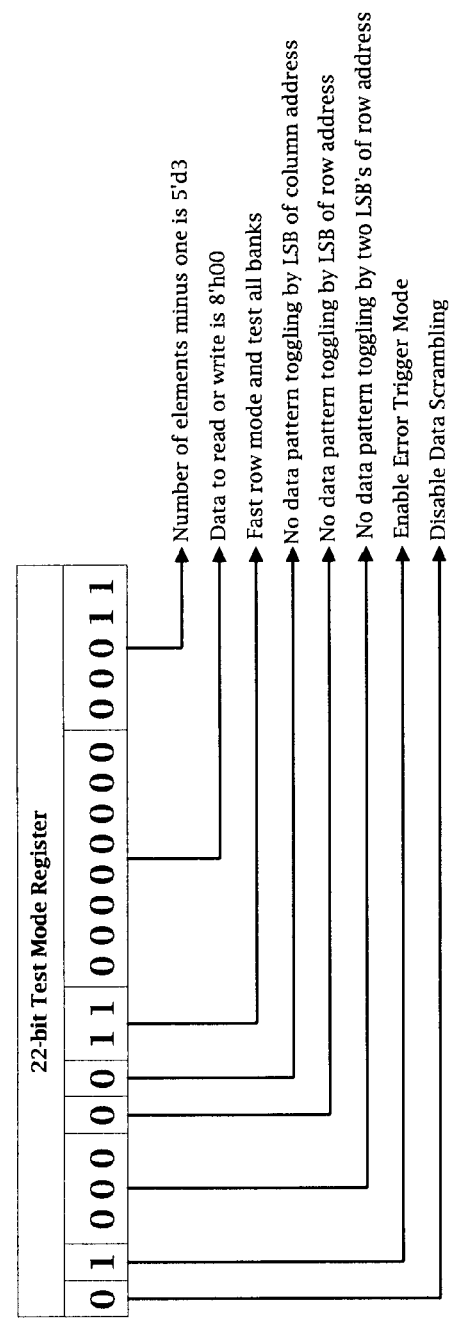
FIG. 4 illustrates an example of a programmed test mode register included in a set of programmable BIST registers according to one embodiment of the present invention.

The test mode register 208 defines test settings for each element programmed in the plurality of test element control registers 202. FIG. 4 provides one embodiment of a programmed test mode register. The programmed test mode register may comprise twenty-two control bits. It is understood that the test mode register 208 may comprise any suitable number of control bits. It is further understood that the test mode register 208 may comprise a control bit for any suitable function and/or any combination of control bits providing various functions, such functions and combinations not being limited to those discussed below.

The programmed test mode register comprises a first bit for disabling/enabling a data scrambling function and a second bit for disabling/enabling an error triggering mode. In the present embodiment, the error triggering mode is enabled, which provides an innovative error triggering mode for logging failures that arise when a test is run on the memory 110. The present embodiment logs failures by finding, storing, and logging one defect at a time. For example, in one embodiment, the method involves running the test, detecting a first error, logging the first error, storing the location of the first error as a trigger point, running the test through the trigger point until detecting a second error, logging the second error, storing the location of the second error as the new trigger point, running the test through the trigger point until detecting a third error, etc. The present embodiment of the error triggering method to log failures results in low area overhead.

Unlike conventional pBIST architectures, the test mode register 208 includes three separate controls for managing data pattern toggling. The three separate data pattern toggling controls allow a special mode for a dynamic disturb test, particularly useful when testing dynamic random access memory. In the present embodiment, the programmed test mode register includes a three-bit field (the third, fourth, and fifth bits) to control data pattern toggling for creating various wordline patterns, a bit (the sixth bit) to control data pattern toggling by row address, and a bit (the seventh bit) to control data pattern toggling by column address. The programmed test mode register further includes a two-bit field (the eighth and ninth bits) for disabling/enabling a fast row mode and specifying whether all banks will be tested; an eight-bit field (the tenth through seventeenth bits) for specifying the data to be read or written; and a five-bit field (the eighteenth through twenty-second bits) indicating the number of elements in the test minus one.

The test loop register 210 selects and determines the number of times to repeat a test (i.e., a particular algorithm or set of algorithms). The test loop register 210 may repeat the test until receiving a stop command, allowing an infinitely looped test. The test control register 212 issues a run command to the pBIST to initiate a test (or tests).

Conventional pBIST architectures run tests/algorithms on all the memory banks within a memory array, i.e., a first test element is applied to all the bits in every bank, then a second test element is applied to all the bits in every bank, etc. The present embodiment provides programmable banks for testing. The bank start register 214 and the bank stop register 216 control the banks that a test element or test elements are applied to. The bank start register 214 defines a starting bank for the test run. The bank stop register 216 defines an end bank for the test run. For example, in one embodiment, the memory 110 may comprise thirty-two (32) banks, Bank #0 to Bank #31. The bank start register 214 can be programmed to Bank #2, and the bank stop register 216 can be programmed to Bank #15. Accordingly, the test element will run through all the bits in Bank #2, all the bits in Bank #3, . . . to all the bits of Bank #15. The programmable bank start register 214 and bank stop register 216 allow testing various memory banks within the memory cell, as opposed to requiring a test to run on all memory banks within the memory cell. In some embodiments, a test element may be run on only one bank. In some embodiments, a test element may be run on only certain sections/banks of the memory.

The test status register 218 logs the results from each test the pBIST runs. The failure count register 210 stores and reports the number of total failures that occurred in a particular test run. The failure address register 212 stores and reports the number of total address failures that occurred in a particular test run. The failure data register 214 stores and reports the number of total data failures that occurred in a particular test run.

The finite state machine (CTRL_FSM) 130 is programmable to execute particular sequences of tests on the memory or memories 110 based upon the test instructions received from the instruction module 120 and the pBIST registers 200. The test pattern generator (TPG) 140 includes the data generator 142 and the address generator 144. Together the data generator 142 and address generator 144 generate test addresses and test data according to control signals received from finite state machine 130. The comparator 150 functions to compare the actual response of the memory 110 with a known, stored response. The memory control module 160 applies the test addresses and test data received from the test pattern generator 140 to the memory (or memories) 110 under test.

Overall, the disclosed embodiments provide one or more of the following advantages: (1) element based programmability of large sets of test instructions; (2) a programmable repeat function and a programmable repeat count function; (3) a programmable retention test and a programmable refresh test, particularly useful when testing DRAM; (4) a special test mode for the dynamic disturb fault test; (5) programmable banks for testing; (6) innovative error triggering to log failures occurring in the tested memory (or memories); (7) small area overhead with high flexibility in debugging RAM; and (8) ensuring DRAM quality by providing such tests as the programmable retention test, the programmable refresh test, and the special test mode for the dynamic disturb fault test.

In summary, a system is provided that effectively provides large sets of test instructions suitable for complex embedded memories while providing reduced area overhead. In one embodiment, a system for testing a memory of an integrated circuit comprises a set of registers providing element based programmability for a plurality of tests, wherein each test includes a plurality of test elements; a finite state machine for receiving a plurality of test instructions from the set of registers, wherein the finite state machine dispatches signals instructing a test pattern generator to generate a test pattern; a memory control module for applying the generated test pattern to the memory; and a comparator module for comparing a response received from the memory to a stored, known response.

In some embodiments, the set of registers includes a plurality of test element control registers for defining a plurality of test elements. In some embodiments, the plurality of test element control registers includes at least one bit for controlling a write function and at least one bit for controlling a read function. In some embodiments, the plurality of test element control registers comprises at least one programmable bit for enabling a repeat function. In some embodiments, the plurality of test element control registers comprises at least one programmable bit for enabling a refresh function.

In some embodiments, the set of registers includes a test element repeat count register that specifies for at least one test element control register defining a test element the number of times the test element will be repeated. In some embodiments, the set of registers includes at least one test mode register for defining test settings for the plurality of test element control registers. In some embodiments, the at least one test mode register comprises at least one bit for controlling data pattern toggling by column address, at least one bit for controlling data pattern toggling by row address, and at least one bit for controlling data pattern toggling to create wordline patterns. In some embodiments, the at least one test mode register comprises at least one programmable bit for enabling an error triggering mode.

In some embodiments, the set of registers includes a refresh time register that defines at least one time for inserting a refresh. In some embodiments, the set of registers includes a bank start register and a bank stop register, wherein the bank start register defines a starting bank of the memory for a test and the bank stop register defines a stopping bank of the memory for a test. In some embodiments, the bank start register and the bank stop register provides the capability to test individual memory banks and various groups of memory banks. In some embodiments, the set of registers includes a test loop register that selects to repeat a test until a stop command is received.

In some embodiments, the plurality of tests includes Zero-One, Checkerboard, MATS, MATS+, MATS++, March X, March C, March C–, March Y, MOVI, and Disturb. In some embodiments, at least one of the plurality of tests includes a pause test element.

In one embodiment, a method for testing a memory of an integrated circuit, wherein the memory comprises a plurality of memory banks, comprises programming a set of registers including programming a plurality of test elements, wherein various combinations of the programmed plurality of test elements represent a plurality of tests; generating a plurality of test instructions consistent with the programmed set of registers; executing the plurality of test instructions to test the memory; storing results arising from the executed plurality of test instructions; and determining the quality of the memory by comparing the stored results to a known response.

In some embodiments, programming the plurality of test elements further comprises enabling a repeat function for at least one of the plurality of test elements and defining the number of times for the at least one test element to be repeated. In some embodiments, programming the plurality of test elements further comprises enabling a refresh function for at least one of the plurality of test elements and defining the time for inserting the refresh. In some embodiments, programming the set of registers further comprises defining a starting memory bank and defining a stopping memory bank, wherein said defining provides the capability to test individual memory banks and various groups of memory banks. In some embodiments, executing the plurality of test instructions and storing the results arising from the executed plurality of instructions further comprises detecting and logging the location of a first error in the memory, storing said location as a trigger point; continuing the execution of the plurality of instructions through the trigger point until detecting and logging the location of a second error in the memory, storing the location of the second error as the trigger point; continuing the execution of the plurality of instructions through the trigger point until detecting and logging a location of successive errors in the memory, storing the location of each successive error as the trigger point until the execution of the plurality of instructions ceases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for testing a memory of an integrated circuit comprising:
    a set of registers providing element based programmability for a plurality of tests, wherein each test includes a plurality of test elements;
    a finite state machine for receiving a plurality of test instructions from the set of registers, wherein the finite state machine dispatches signals instructing a test pattern generator to generate a test pattern;
    a memory control module for applying the generated test pattern to the memory; and
    a comparator module for comparing a response received from the memory to a stored, known response.

2. The system of claim 1 wherein the set of registers includes a plurality of test element control registers for defining the plurality of test elements.

3. The system of claim 2 wherein the plurality of test element control registers includes at least one bit for controlling a write function and at least one hit for controlling a read function.

4. The system of claim 2 wherein the plurality of test element control registers comprises at least one programmable hit for enabling a repeat function.

5. The system of claim 2 wherein the plurality of test element control registers comprises at least one programmable hit for enabling a refresh function.

6. The system of claim 2 wherein the set of registers includes a test clement repeat count register that specifics for at least one test element control register defining a test clement the number of times the test element will be repeated.

7. The system of claim 2 wherein the set of registers includes at least one test mode register for defining test settings for the plurality of test element control registers.

8. The system of claim 7 wherein the at least one test mode register comprises at least one bit for controlling data pattern toggling by column address, at least one bit for controlling data pattern toggling by row address, and at least one bit for controlling data pattern toggling to create wordline patterns.

9. The system of claim 7 wherein the at least one test mode register comprises at least one programmable bit for enabling an error triggering mode.

10. The system of claim 1 wherein the set of registers includes a refresh time register that defines at least one time for inserting a refresh.

11. The system of claim 1 wherein the set of registers includes a hank start register and a bank stop register, wherein the hank start register defines a starting bank of the memory for a test and the bank stop register defines a stopping bank of the memory for a test.

12. The system of claim 11 wherein the bank start register and the bank stop register provides the capability to test individual memory banks and/or various groups of memory banks.

13. The system of claim 1 wherein the set of registers includes a test loop register that selects to repeat a test until a stop command is received.

14. The system of claim 1 wherein the plurality of tests includes Zero-One, Checkerboard, MATS, MATS+, MATS++, March X, March C, March C–, March Y, MOVI, and Disturb.

15. The system of claim 14 wherein at least one of the plurality of tests includes a pause test element.

16. A method for testing a memory of an integrated circuit, wherein the memory comprises a plurality of memory banks, the method comprising:
   programming a set of registers including programming a plurality of test elements, wherein various combinations of the programmed plurality of test elements represent a plurality of tests;
   generating a plurality of test instructions consistent with the programmed set of registers;
   receiving at a state machine the plurality of test instructions from the set of registers;
   executing the plurality of test instructions to test the memory;
   storing results arising from the executed plurality of test instructions; and
   determining the quality of the memory by comparing the stored results to a known response.

17. The method for testing the memory of claim 16 wherein programming the plurality of test elements further comprises enabling a repeat function for at least one of the plurality of test elements and defining the number of times for the at least one test clement to be repeated.

18. The method for testing the memory of claim 16 wherein programming the plurality of test elements further comprises enabling a refresh function for at least one of the plurality of test elements and defining the time for inserting the refresh.

19. The method for testing the memory of claim 16 wherein programming the set of registers further comprises defining a starting memory hank and defining a stopping memory bank, wherein said defining provides the capability to test individual memory banks and various groups of memory banks.

20. A method for testing a memory of an integrated circuit, wherein the memory comprises a plurality of memory banks the method comprising:
   programming a set of registers including programming a plurality of test elements, wherein various combinations of the programmed plurality of test elements represent a plurality of tests;
   generating a plurality of test instructions consistent with the programmed set of registers; executing the plurality of test instructions to test the memory;
   storing results arising from the executed plurality of test instructions; and
   determining the quality of the memory by comparing the stored results to a known response, wherein executing the plurality of test instructions and storing the results arising from the executed plurality of instructions further comprises:
   detecting and logging the location of a first error in the memory, storing said location as a trigger point;
   continuing the execution of the plurality of instructions through the trigger point until detecting and logging the location of a second error in the memory, storing the location of the second error as the trigger point;
   continuing the execution of the plurality of instructions through the trigger point until detecting and logging a location of successive errors in the memory, storing the location of each successive error as the trigger point until the execution of the plurality of instructions ceases.

* * * * *